United States Patent
Pan et al.

(10) Patent No.: US 7,936,009 B2
(45) Date of Patent: May 3, 2011

(54) SHIELDED GATE TRENCH FET WITH AN INTER-ELECTRODE DIELECTRIC HAVING A LOW-K DIELECTRIC THEREIN

(75) Inventors: James Pan, West Jordan, UT (US); James J. Murphy, South Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/170,328

(22) Filed: Jul. 9, 2008

(65) Prior Publication Data

US 2010/0006928 A1    Jan. 14, 2010

(51) Int. Cl.
 *H01L 29/76* (2006.01)
 *H01L 29/94* (2006.01)
(52) U.S. Cl. ..... 257/330; 257/332; 257/333; 257/E29.2; 257/E29.201
(58) Field of Classification Search .................. 257/330, 257/332, 333, E29.2, E29.201
See application file for complete search history.

(56) References Cited

U.S. PATENT DOCUMENTS

| | | | |
|---|---|---|---|
| 6,107,667 A | 8/2000 | An et al. | |
| 7,227,230 B2 | 6/2007 | Gambino et al. | |
| 7,294,937 B2 | 11/2007 | Su et al. | |
| 7,345,342 B2 * | 3/2008 | Challa et al. | 257/341 |
| 7,385,248 B2 | 6/2008 | Herrick et al. | |
| 7,446,374 B2 * | 11/2008 | Thorup et al. | 257/330 |
| 7,473,603 B2 * | 1/2009 | Kraft et al. | 438/259 |
| 2006/0273386 A1 * | 12/2006 | Yilmaz et al. | 257/330 |
| 2007/0032020 A1 | 2/2007 | Grebs et al. | |
| 2009/0020810 A1 * | 1/2009 | Marchant | 257/331 |
| 2009/0230465 A1 * | 9/2009 | Yilmaz et al. | 257/330 |

* cited by examiner

*Primary Examiner* — Ngan Ngo
(74) *Attorney, Agent, or Firm* — Kilpatrick Townsend & Stockton LLP (57) ABSTRACT

A shielded gate trench field effect transistor (FET) comprises trenches extending into a semiconductor region. A shield electrode is disposed in a bottom portion of each trench. The shield electrode is insulated from the semiconductor region by a shield dielectric. A gate electrode is disposed in each trench over the shield electrode, and an inter-electrode dielectric (IED) comprising a low-k dielectric extends between the shield electrode and the gate electrode.

23 Claims, 9 Drawing Sheets

SHIELDED GATE TRENCH FET WITH AN INTER-ELECTRODE DIELECTRIC HAVING A LOW-K DIELECTRIC THEREIN

BACKGROUND OF THE INVENTION

The present invention relates in general to semiconductor technology and, more particularly, to structures and methods for forming inter-electrode dielectrics (IEDs) and other dielectric regions in shielded and non-shielded trench field effect transistors (FETs).

Shielded gate trench FETs are advantageous over conventional FETs in that the shield electrode reduces the gate-drain capacitance ($C_{gd}$) and improves the breakdown voltage of the transistor without sacrificing on-resistance. Conventional shielded gate trench FETs include a shield electrode below a gate electrode. The shield and gate electrodes are insulated from each other by a dielectric layer referred to as an inter-electrode dielectric or IED. The gate electrode is insulated from its adjacent body regions by a gate dielectric. Conventional methods for forming the IED and gate dielectric include thermal oxidation and oxide or nitride chemical vapor deposition (CVD) processes.

The quality, thickness, and method used to fabricate the IED are important as the IED has significant impact on electrical characteristics of the device, such as $R_{DSon}$, $Q_{gd}$, and $I_{gss}$. The IED must be of sufficient quality and thickness to support the required voltage between the shield and gate electrodes. If the IED is too thin, shorts may occur. If the IED is too thick, it may be difficult to ensure that the gate electrode extends below the bottom surface of the body region. If these two regions are misaligned $Q_{gd}$ will decrease and $R_{DSon}$ will increase. Additionally, the gate dielectric must have low interface charges and dielectric trap charges to reduce leakage and increase dielectric quality.

Thus, there is a need for structures and methods for forming shielded gate trench FETs with improved IED and gate dielectrics.

BRIEF SUMMARY OF THE INVENTION

In accordance with an embodiment of the invention, a shielded gate trench field effect transistor (FET) comprises trenches extending into a semiconductor region. A shield electrode is disposed in a bottom portion of each trench. The shield electrode is insulated from the semiconductor region by a shield dielectric. A gate electrode is disposed in each trench over the shield electrode. An inter-electrode dielectric (IED) comprising a low-k dielectric extends between the shield electrode and the gate electrode.

In one embodiment, the gate electrode comprises metal.

In another embodiment, the semiconductor regions further comprises a drift region extending over a substrate, a body region extending over the drift region, and source regions adjacent to each trench in the body regions. In some embodiments, the trenches extend into and terminate within the substrate. In other embodiments, the trenches extend into and terminate within the drift region.

In another embodiment, the IED further comprises an insulating material in a central portion of the IED, and the low-k dielectric extends along the sides and bottom of the insulating material.

In another embodiment, a gate dielectric comprising a high-k dielectric lines the upper trench sidewalls.

In yet another embodiment, the high-k dielectric comprises oxide, and a concentration of the oxide is graded along a thickness of the high-k dielectric. The concentration of the oxide is highest in a portion of the high-k dielectric nearest the semiconductor region.

In accordance with another embodiment of the invention, a method of forming a shielded gate trench field effect transistor (FET) includes the following steps. Trenches are formed in a semiconductor region. A shield electrode is formed in a bottom portion of each trench. An inter-electrode dielectric (IED) is formed over the shield electrode, where the IED includes a low-k dielectric. A gate electrode is formed in an upper portion of each trench over the IED.

In one embodiment, a gate dielectric is formed lining the upper trench sidewalls. The gate dielectric comprises a high-k dielectric.

In one embodiment, the high-k dielectric further extends along the bottom of the gate electrode.

In another embodiment, the gate dielectric further comprises thermal oxide.

The following detailed description and the accompanying drawings provide a better understanding of the nature and advantages of the present invention.

DETAILED DESCRIPTION OF THE INVENTION

In accordance with embodiments of the present invention, the IED of a shielded gate trench FET includes a low-k dielectric. This can increase the effective oxide thickness (EOT) and reduce the thickness sensitivity of the IED. In some embodiments, the gate dielectric of the trench FET includes a high-k dielectric with or without a graded composition. This can improve the gate dielectric quality by increasing breakdown voltage and decreasing leakage current. These and other embodiments of the invention as well as other features and advantages are described in more detail below.

It should be understood that the following description is exemplary only, and the scope of the invention is not limited to these specific examples. Note that the dimensions in the figures of this application are not to scale, and at times the relative dimensions are exaggerated or reduced in size to more clearly show various structural features.

Many low-k dielectrics are not stable at temperatures required to diffuse and activate implants. Thus, in some embodiments, the source and body regions of the transistor are formed prior to low-k deposition. FIGS. 1A-1C and 2A-2C illustrate two techniques whereby the source and body implants and drive-in are carried out prior to deposition of the low-k dielectric, in accordance with embodiments of the invention.

Figure 1A:
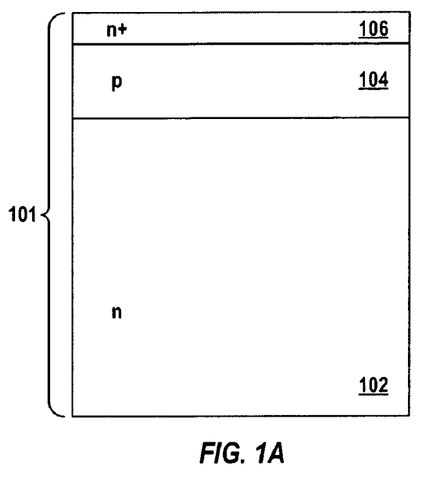
FIGS. 1A-1C are simplified cross-sectional views at various stages of a process for forming a semiconductor structure with source and body regions, according to an embodiment of the invention.
Figure 1B:
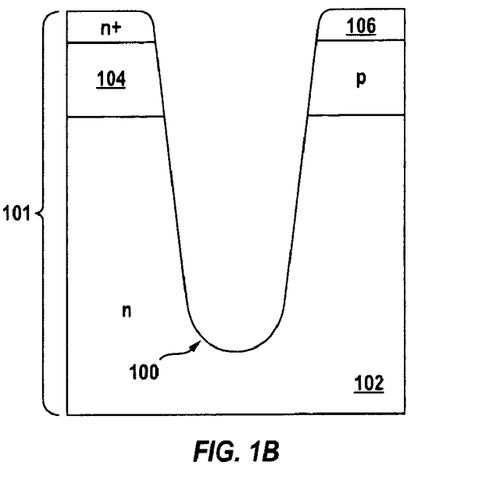

In FIG. 1A, body region 104 of p-type conductivity and source region 106 of n+ type conductivity are formed in an upper portion of semiconductor region 101 using conventional dopant implant and diffusion processes. In FIG. 1B, Trench 100 is formed in semiconductor region 101 using conventional photolithography and etch techniques. In one embodiment, semiconductor region 101 includes n-type drift region 102 extending over a highly doped n+ type substrate (not shown). In some embodiments, trench 100 extends into and terminates within drift region 102. In other embodiments, trench 100 extends through drift region 102 and terminates within the substrate.

Figure 1C:
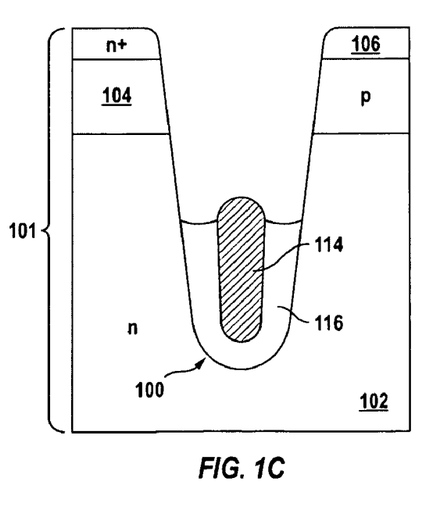

In FIG. 1C, shield dielectric 116 and shield electrode 114 are formed in the bottom portion of trench 100 using known techniques. In one embodiment, formation of shield dielectric 116 may include forming a dielectric layer along the sidewalls and bottom of trench 100 using a conventional oxide deposition or thermal oxidation process. Formation of shield electrode 114 may include forming a layer of polysilicon over the dielectric layer to fill trench 100. The dielectric and polysilicon layers may then be etched using known techniques to recess the layers in the bottom portion of trench 100 and thus form shield dielectric 116 and shield electrode 114. In some embodiments, the top of shield dielectric 116 is recessed below the top of shield electrode 114 as shown in FIG. 1C.

Figure 2A:
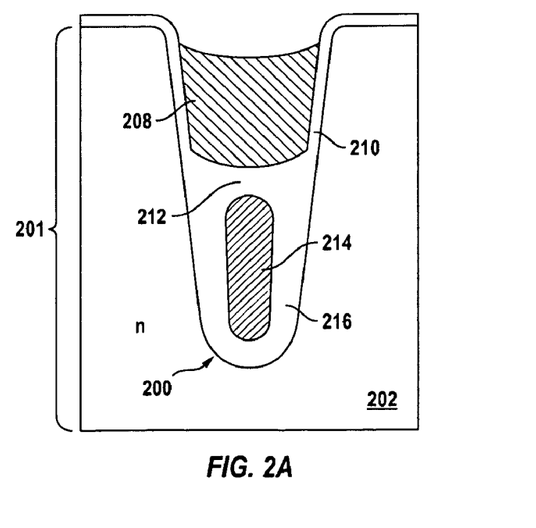
FIGS. 2A-2C are simplified cross-sectional views at various stages of a process for forming a semiconductor structure with source and body regions, according to another embodiment of the invention.
Figure 2B:
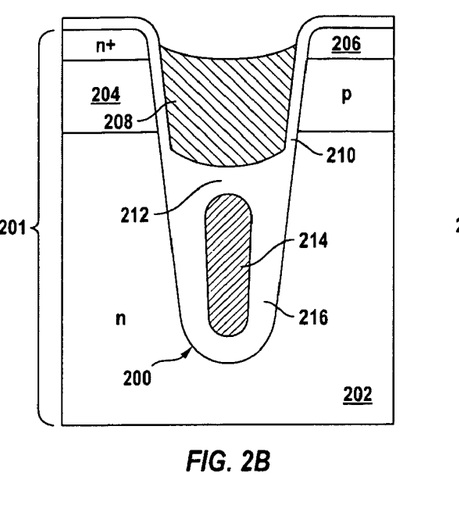
Figure 2C:
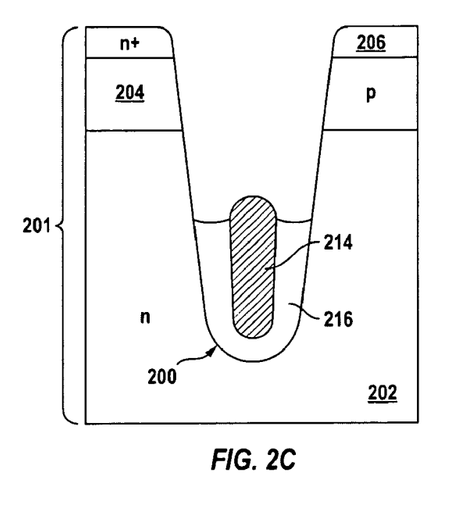

FIGS. 2A-2C illustrate a replacement-gate process where the source and body implants and drive-in are carried out prior to forming the low-k dielectric, according to another embodiment of the invention. In FIG. 2A, trench 200 is formed in semiconductor region 201 using conventional photolithography and etch techniques. Shield dielectric 216 and shield electrode 214 may be formed in the bottom portion of trench 200 in a manner similar to that described above with regard to FIG. 1C. IED 212 is formed over shield electrode 214 using known techniques. In one embodiment, formation of IED 212 may include forming a dielectric layer along the upper trench sidewalls and over shield electrode 214 using conventional oxide deposition or thermal oxidation processes. One or more conventional dry or wet etch processes may be used to recess the dielectric layer and form IED 212. Gate dielectric 210 is formed lining upper sidewalls of trench 200 using known techniques. In one embodiment, formation of gate dielectric 210 may include forming a dielectric layer along the upper trench sidewalls using conventional oxide deposition or thermal oxidation processes. Gate electrode 208 is formed over gate dielectric 210 using conventional polysilicon deposition and etch processes. In one embodiment, formation of gate electrode 208 may include filling trench 200 with polysilicon and using one or more etch processes to recess the polysilicon and form gate electrode 208.

In FIG. 2B, body regions 204 of p-type conductivity and source regions 206 of n+ type conductivity are formed in an upper portion of semiconductor region 201 using conventional dopant implant and diffusion processes. Note that a dielectric cap may be formed over gate electrode 208 before forming the source and body regions. The structure illustrated in FIG. 2C may be formed by removing gate electrode 208, gate dielectric 210, and IED 212 using conventional etch processes. In some embodiments, not all of IED 212 is removed and a layer of IED 212 remains over the top of shield electrode 214 and shield dielectric 216. Shield electrode 214 and shield dielectric 216 remain in the bottom portion of trench 200, while body regions 204 and source regions 206 remain in an upper portion of semiconductor region 201.

The structure illustrated in FIGS. 1C and 2C can be further processed to form a shielded gate trench FET comprising a low-k IED according to embodiments of the present invention. FIGS. 3A-3I are simplified cross-sectional views at various stages of a process for forming the shielded gate trench FET structure, according to an embodiment of the invention In FIG. 3A, low-k dielectric 318 is formed along upper trench sidewalls and over shield electrode 314 and shield dielectric 316 using known techniques. Low-k dielectric 318 may also cover the mesa regions adjacent to trench 300. In one embodiment, low-k dielectric 318 may be formed using a conventional low-k deposition process and have an effective oxide thickness (EOT) in the range of 1000-2000 Å. EOT refers to the physical (or actual) thickness of silicon oxide having the same capacitance per unit area. For the same EOT, the physical thickness of a low-k film is thinner than silicon oxide due to the lower dielectric constant. The physical thickness of low-k dielectric 318 will depend on its dielectric constant.

Figure 3A:
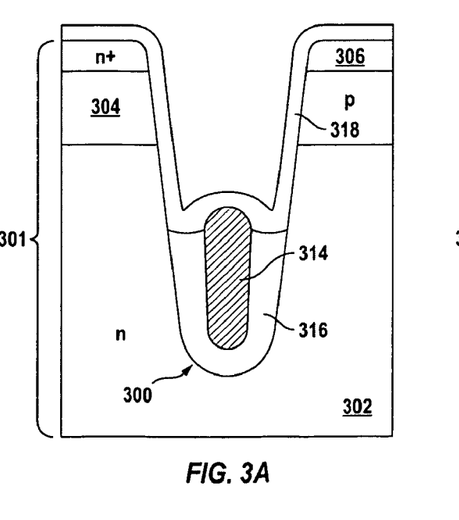
FIGS. 3A-3I are simplified cross-sectional views at various stages of a process for forming an IED and gate dielectric of a shielded gate trench FET structure, according to an embodiment of the invention.

While the present invention is not limited to a particular low-k material, some examples of materials that may be used to form low-k dielectric 318 include doped oxide, porous oxide, organic materials, and others. Oxide having the formula $SiO_x$, where x<2, may also be used. Dopants commonly used to decrease the dielectric constant of the oxide include carbon, hydrogen, fluorine, and others.

Figure 3B:
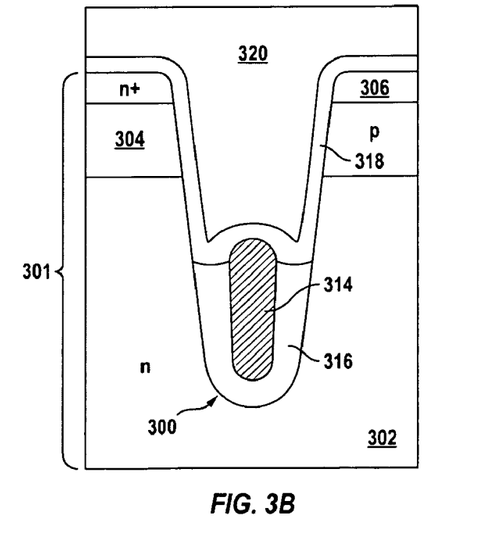
Figure 3C:
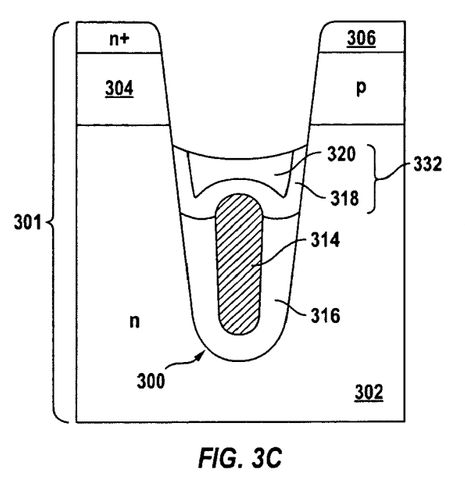

In FIG. 3B, insulating material 320 is formed in the upper interior portion of trench 300 using known techniques. In one embodiment, dielectric material 320 comprises undoped oxide and may be formed using a conventional oxide deposition process. For example, insulating material 320 may comprise TEOS and be formed using a conventional chemical vapor deposition (CVD) process. In FIG. 3C, low-k dielectric 318 and insulating material 320 are recessed using one or more conventional etch processes to form inter-electrode dielectric (IED) 332.

In one embodiment, IED 332 includes insulating material 320 in the central portion of IED 332, with low-k dielectric 318 extending along the sides and bottom of insulating material 320. In some embodiments, IED 332 may also include a layer of IED 212 that remained over the top of the shield electrode as explained above with regard to FIG. 2B. The top of IED 332 along the trench sidewalls may be recessed below body region 304.

An IED comprising a low-k dielectric increases the EOT, thus enabling the IED to support a higher voltage. Additionally, an IED comprising a low-k dielectric is less susceptible to effects from thickness variations. For example, if an IED is oxide with a dielectric constant of 3.9 and a target EOT of 1000 Å, a 10% decrease in thickness will decrease the physical thickness and the EOT to 900 Å, which is below the target. In contrast, if an IED comprises a low-k dielectric with a physical thickness of 1000 Å and an EOT of 1500 Å, a 10% decrease in thickness will decrease the physical thickness to 900 Å, but the EOT would still be 1350 Å, which is above the target. Thus, an IED comprising a low-k dielectric advantageously provides margin to support the required voltage between the shield and gate electrodes.

Figure 3D:
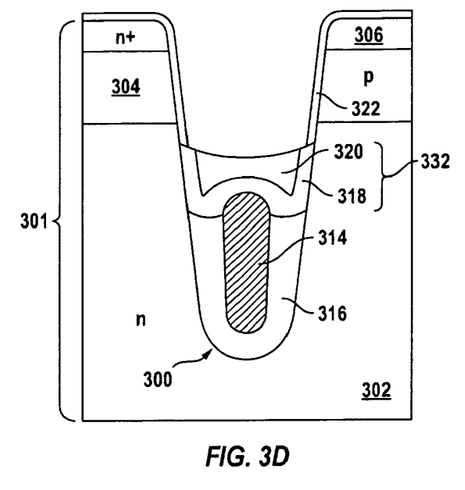

As shown in FIG. 3D, dielectric 322 may be formed along upper sidewalls of trench 300 using a conventional deposition or thermal oxidation process. In one embodiment, dielectric 322 may comprise oxide having a thickness in the range of 50-200 Å. In some embodiments, dielectric 322 may be formed at relatively low temperatures to prevent degradation of low-k dielectric 318. For example, in one embodiment dielectric 322 may be formed using a thermal oxidation process at a temperature between 650-750° C. A thermal oxide can improve the gate dielectric quality by lowering the interface charges and dielectric trap charges compared to a deposited gate dielectric.

Figure 3E:
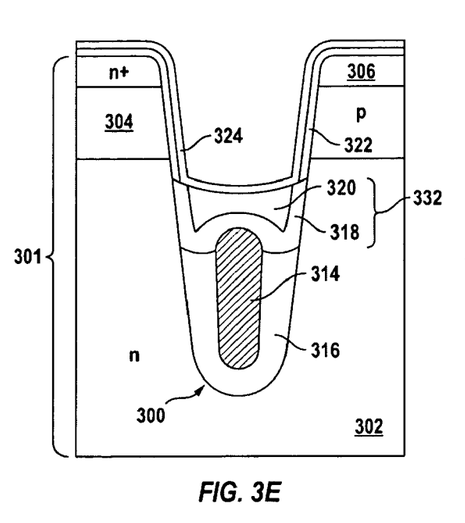

As shown in FIG. 3E, high-k dielectric 324 may be formed over dielectric 322 and IED 332 using known techniques. In one embodiment, high-k dielectric 324 may be formed using a conventional atomic layer deposition (ALD), CVD, or physical vapor deposition (PVD) process. For example, in one embodiment high-k dielectric 324 may be formed using an ALD process and have an EOT in the range of 50-500 Å. For the same EOT, the physical thickness of a high-k film is thicker than silicon oxide due to the higher dielectric constant. The physical thickness of high-k dielectric 324 will depend on its dielectric constant. In one embodiment, high-k dielectric 324 may comprise hafnium oxide ($HfO_x$) having a physical thickness in the range of 100-700 Å.

While the present invention is not limited to a particular high-k material, some examples of high-k materials that may be used to form high-k dielectric 324 include doped oxides, metal oxides and their silicates, and others. One dopant commonly used to increase the dielectric constant of oxide is nitrogen. Metal oxides commonly used include hafnium oxide, zirconium oxide, and others.

In some embodiments, the gate dielectric includes only one of dielectric 322 or high-k dielectric 324. For example, in some embodiments high-k dielectric 324 may replace dielectric 322. In these embodiments, high-k dielectric 324 may line the upper trench sidewalls and may be in direct contact with the semiconductor region. Many high-k dielectrics can be formed at relatively low temperatures and may more easily integrate with low-k dielectrics having low temperature stability. In other embodiments, only dielectric 322 may be formed to serve as the gate dielectric for insulating the gate electrode from surrounding body regions.

Additionally, in some embodiments high-k dielectric 324 may have a graded composition to obtain the desired EOT, improve breakdown, and reduce leakage current. For example, in embodiments where the gate dielectric includes only high-k dielectric 324, the composition of high-k dielectric 324 may be graded to improve dielectric quality. As an example, a high-k dielectric comprising oxide may have the highest concentration of oxide near the interface with the semiconductor region. A higher concentration of oxide generally improves film quality by lowering interface trap charges and dielectric trap charges.

Figure 3F:
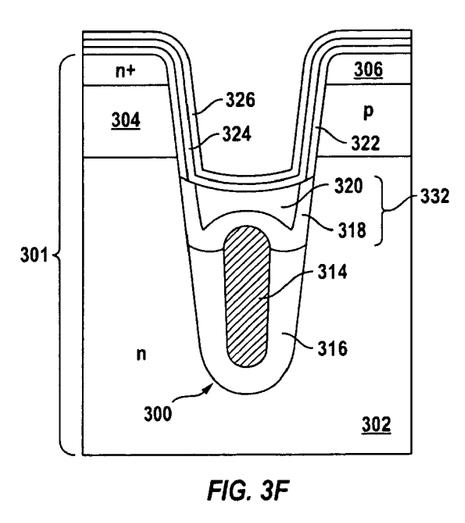

As shown in FIG. 3F, conductive liner 326 may be formed over high-k dielectric 324 using known techniques. In one embodiment, conductive liner 326 may comprise metal and be formed using a conventional metal deposition process having a thickness in the range of 150-700 Å. In some embodiments, conductive liner 326 may be used to adjust the workfunction of a subsequently formed metal gate electrode and the transistor threshold voltage. Conductive liner 326 may also provide a barrier between a metal gate electrode and the gate dielectric. Some examples of materials commonly used to form conductive liner 326 include tantalum, tantalum nitride, titanium nitride, and others.

Figure 3G:
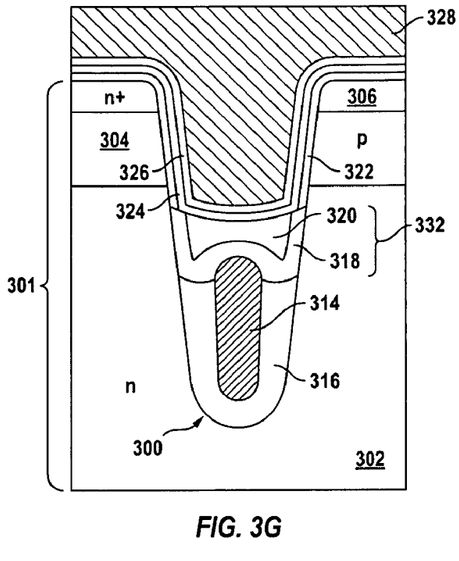
Figure 3H:
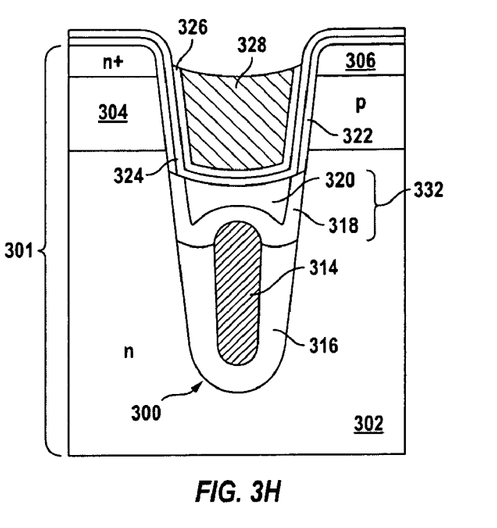

In FIGS. 3G and 3H, gate electrode 328 is formed using known techniques. In one embodiment, gate electrode 328 may comprise metal and be formed using conventional metal deposition and etch processes. For example, a deposition process may be used to deposit the gate electrode layer and fill trench 300 as shown in FIG. 3G. One or more etch processes may then be used to recess the layer and form gate electrode 328 as shown in FIG. 3H. In other embodiments, gate electrode 328 may comprise polysilicon (doped or undoped) and be formed using conventional polysilicon deposition and etch processes. In these embodiments, the polysilicon electrode may replace the liner and the metal electrode.

Figure 3I:
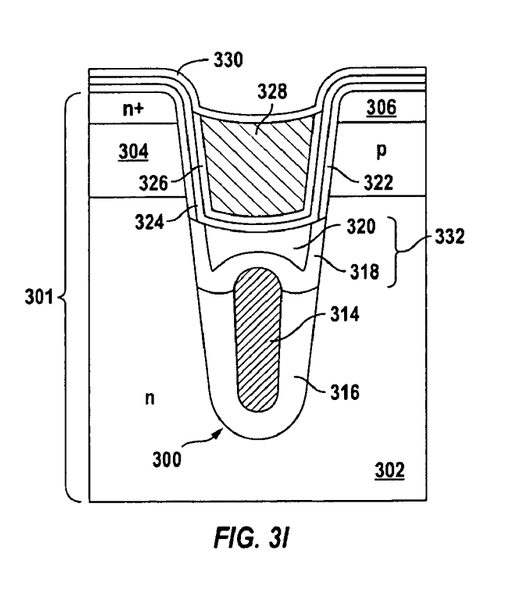

As shown in FIG. 3I, dielectric liner 330 may be formed over the structure using known techniques. In one embodiment, dielectric liner 330 may comprise nitride and be formed using a conventional LPCVD process. In some embodiments, dielectric liner 330 may prevent oxidation of gate electrode 328 and conductive liner 326 during subsequent processes.

Figure 4:
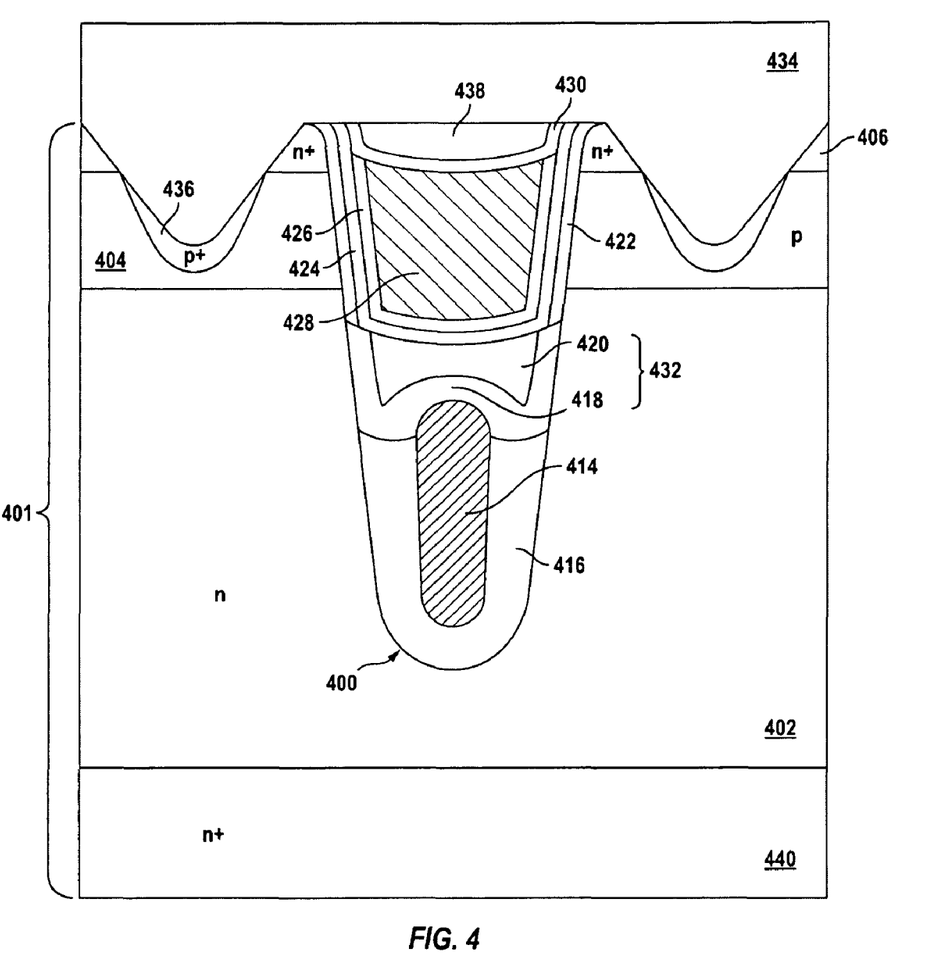
FIG. 4 is a simplified cross-sectional view of a shielded gate trench FET structure, according to an embodiment of the invention.

The remaining portions of the shielded gate trench FET structure can be formed using any one of a number of known techniques. FIG. 4 shows a simplified cross-sectional view of a more complete shielded gate trench FET structure, according to an embodiment of the invention.

In FIG. 4, semiconductor region 401 includes an n-type drift region 402 over a highly doped n+ type substrate 440. In this embodiment, trench 400 extends into drift region 402. Body regions 404 of p-type conductivity extend over drift region 402. Source regions 406 of n+ type conductivity flank trench 400. In one embodiment, drift region 402 is part of an n-type epitaxial layer that is formed over substrate 440 using known techniques. Shield dielectric 416, shield electrode 414, IED 432, the gate dielectric (including dielectric 422 and high-k dielectric 424), conductive liner 426, gate electrode 428, and dielectric liner 430 are all formed using techniques similar to those described in connection with FIGS. 3A-3I.

The cross section in FIG. 4 corresponds to an embodiment where an open cell configuration is used with source regions 406 and trench 400 being stripe-shaped and extending parallel to one another. Heavy body regions 436 of p+ type conductivity are formed periodically or continuously along the source stripes using conventional processes. Triangular-shaped source and heavy body contacts may be formed using conventional self-aligned processes. In one embodiment, a dielectric layer (e.g., BPSG) is formed over the structure using known techniques. Conventional etch and/or chemical mechanical polishing (CMP) processes are used to recess the dielectric layer and form dielectric cap 438. In other embodiments, the dielectric layer may be patterned to form a dielectric dome (not shown) using known techniques. In this embodiment, the dielectric dome may be used to form heavy body contact openings. A topside conductive interconnect layer 434 (e.g., comprising metal) that electrically contacts source regions 406 and heavy body regions 436 may be formed over the entire structure. Similarly, a bottom-side conductive interconnect layer (not shown), e.g., comprising metal, that electrically contacts the backside of substrate 440 may be formed using known techniques. The method of the present invention is not limited to an open cell configuration. The implementation of the present invention in a closed cell configuration would be obvious to one skilled in the art in view of this disclosure.

FIGS. 5A-5H are simplified cross-sectional views illustrating an alternative process for forming a shielded gate trench FET comprising a low-k IED according to another embodiment of the invention. Like the process illustrated in FIGS. 3A-3T, this process begins with the structure illustrated in FIG. 1C or 2C.

Figure 5A:
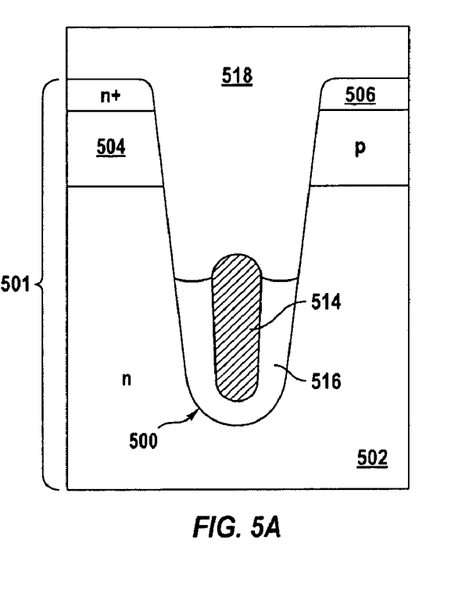
FIGS. 5A-5H are simplified cross-sectional views at various stages of a process for forming an IED and gate dielectric of a shielded gate trench FET structure, according to another embodiment of the invention.
Figure 5B:
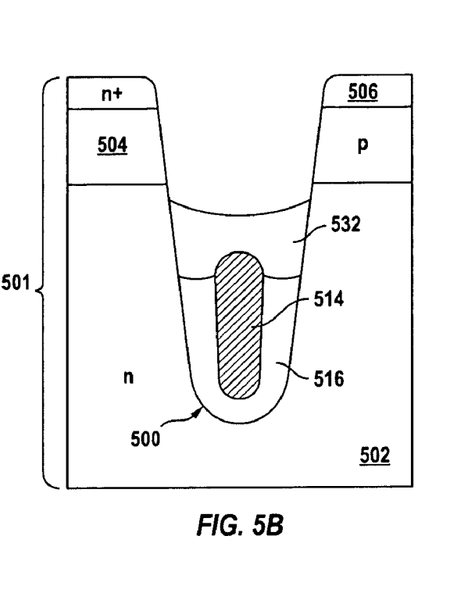

In FIG. 5A, low-k dielectric 518 is formed in trench 500 over shield electrode 514 and shield dielectric 516 using known techniques (e.g. spin-on or CVD processes). In FIG. 5B, low-k dielectric 518 is recessed using one or more conventional etch processes to form inter-electrode dielectric (IED) 532. The top of IED 532 along the trench sidewalls may be recessed below body region 504.

Figure 5C:
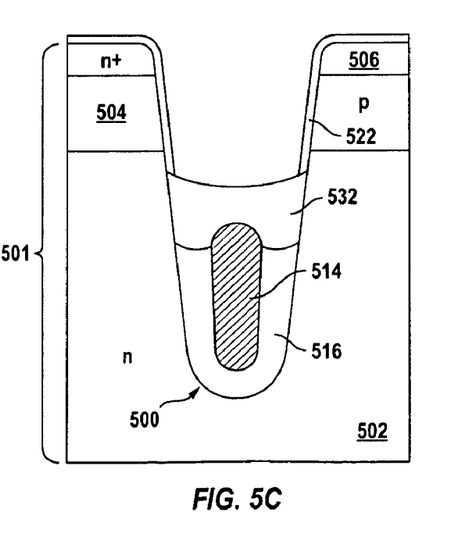
Figure 5D:
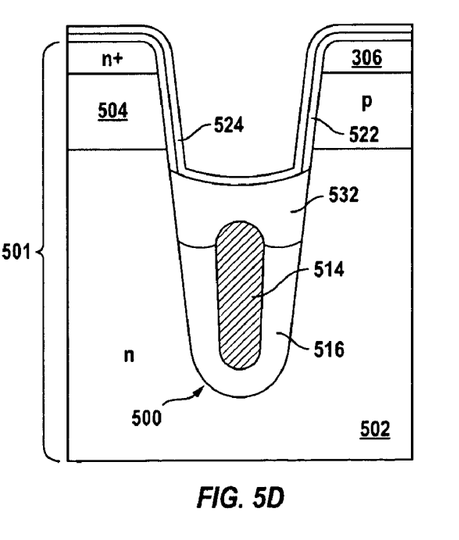
Figure 5E:
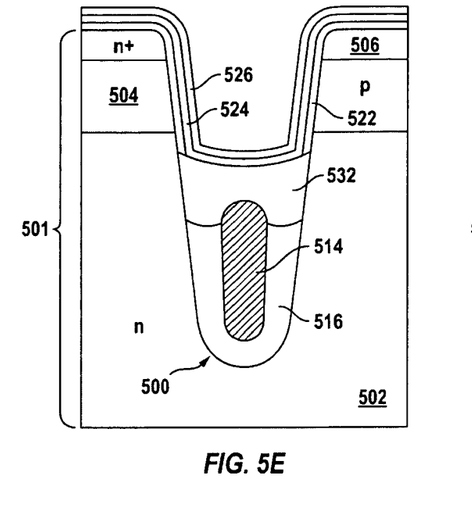
Figure 5F:
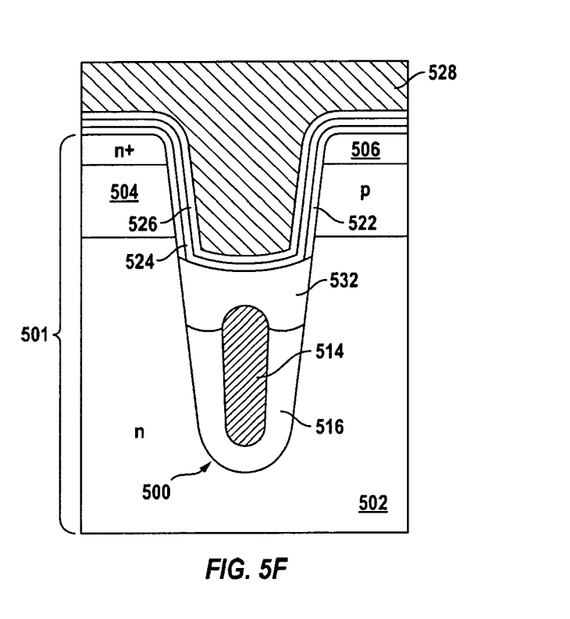
Figure 5G:
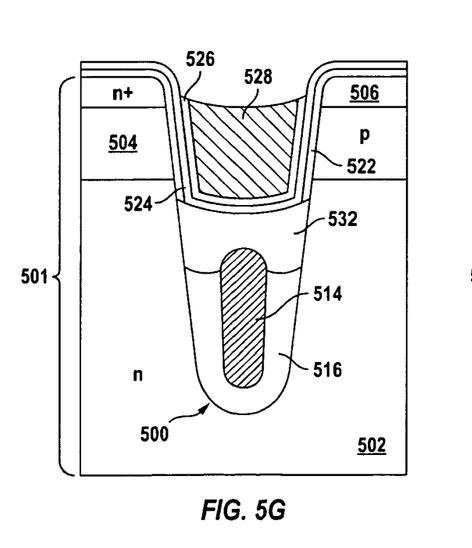
Figure 5H:
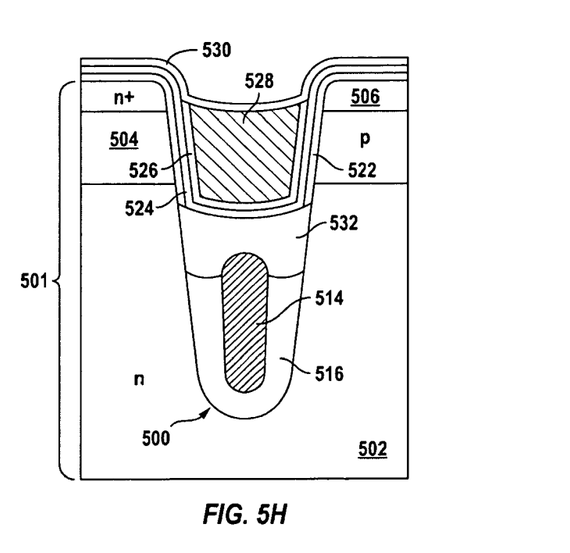

The remaining process steps illustrated in FIGS. 5C-5H are similar to those described above with regard to FIGS. 3D-3I, respectively, and thus will only be briefly described. As shown in FIG. 5C, dielectric 522 may be formed along upper sidewalls of trench 500 using a conventional oxide deposition or thermal oxidation process. As shown in FIG. 5D, high-k dielectric 524 may be formed over dielectric 522 using known techniques. Dielectric 522 and high-k dielectric 524 form the gate dielectric. As shown in FIG. 5E, conductive liner 526 may be formed over high-k dielectric 524 using a conventional metal deposition process. In FIGS. 5F and 5G, gate electrode 528 is formed using conventional deposition and etch processes. As shown in FIG. 5H, dielectric liner 330 may be formed over the structure using conventional deposition processes.

Figure 6:
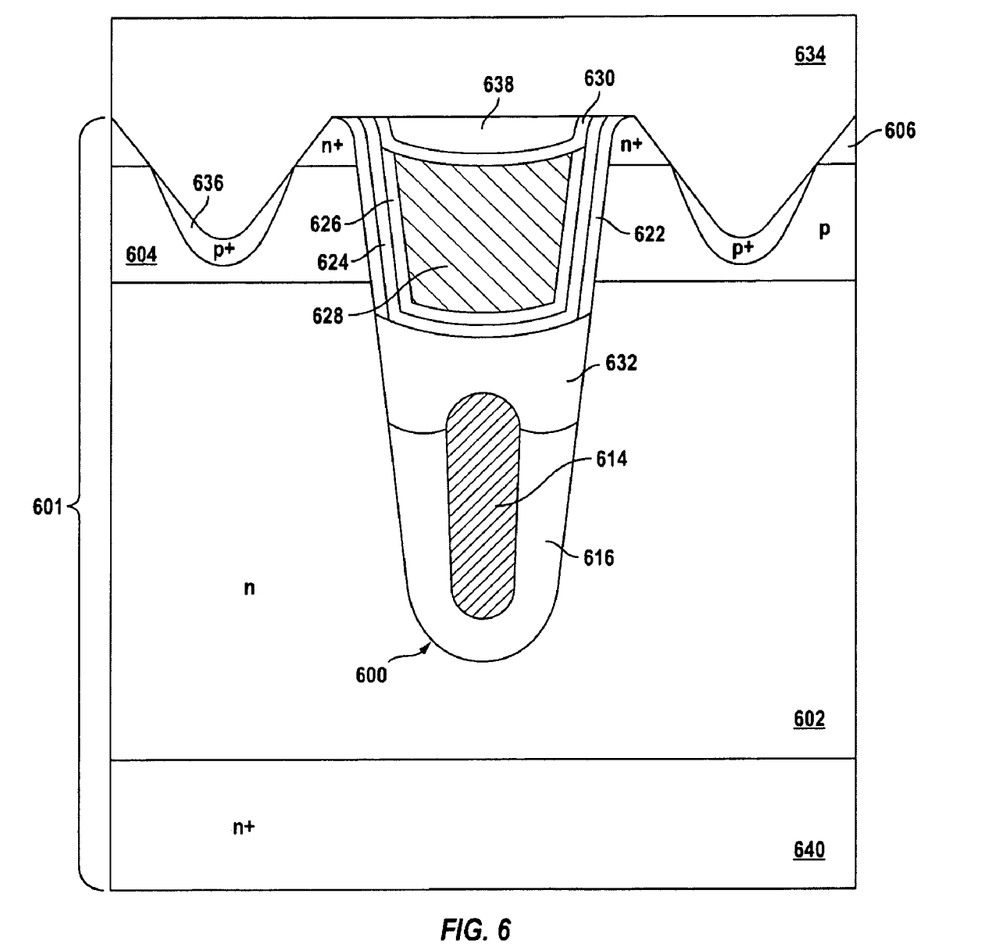
FIG. 6 is a simplified cross-sectional view of a shielded gate trench FET structure, according to an embodiment of the invention.

The remaining portions of the shielded gate trench FET structure can be formed using any one of a number of known techniques. FIG. 6 shows a simplified cross-sectional view of a more complete shielded gate trench FET structure, according to an embodiment of the invention. The structure illustrated in FIG. 6 is similar to the structure illustrated in FIG. 4. In FIG. 6, however, IED 632 does not include insulating material 420. Instead, IED 632 is comprised only of low-k dielectric.

The IED and gate dielectric formed according to embodiments of the invention enjoy, among other advantages and features, increased EOT (IED with lower dielectric constant has higher EOT compared to oxide), reduced thickness sensitivity (IED has margin to support the required voltage between shield and gate electrodes), improved alignment of IED and body regions (decreased physical thickness of IED provides margin), compatibility with the low temperature stability of many low-k dielectrics (source and body regions can be formed prior to low-k dielectric formation), and improved gate dielectric quality (by grading the composition of the high-k dielectric).

In some embodiments, a low-k dielectric is advantageously integrated in the shield dielectric of a shielded gate trench FET using similar techniques to those described above. For example, shield dielectric 416 in FIG. 4 may comprise a low-k dielectric formed in a similar manner to low-k dielectric 418. Such a low-k shield dielectric can be carefully designed together with the doping concentration of drift region 402 to obtain optimum charge balancing in the drift region while minimizing the $R_{DSon}$ and without adversely impacting the breakdown characteristics of the shield dielectric.

Figure 7:
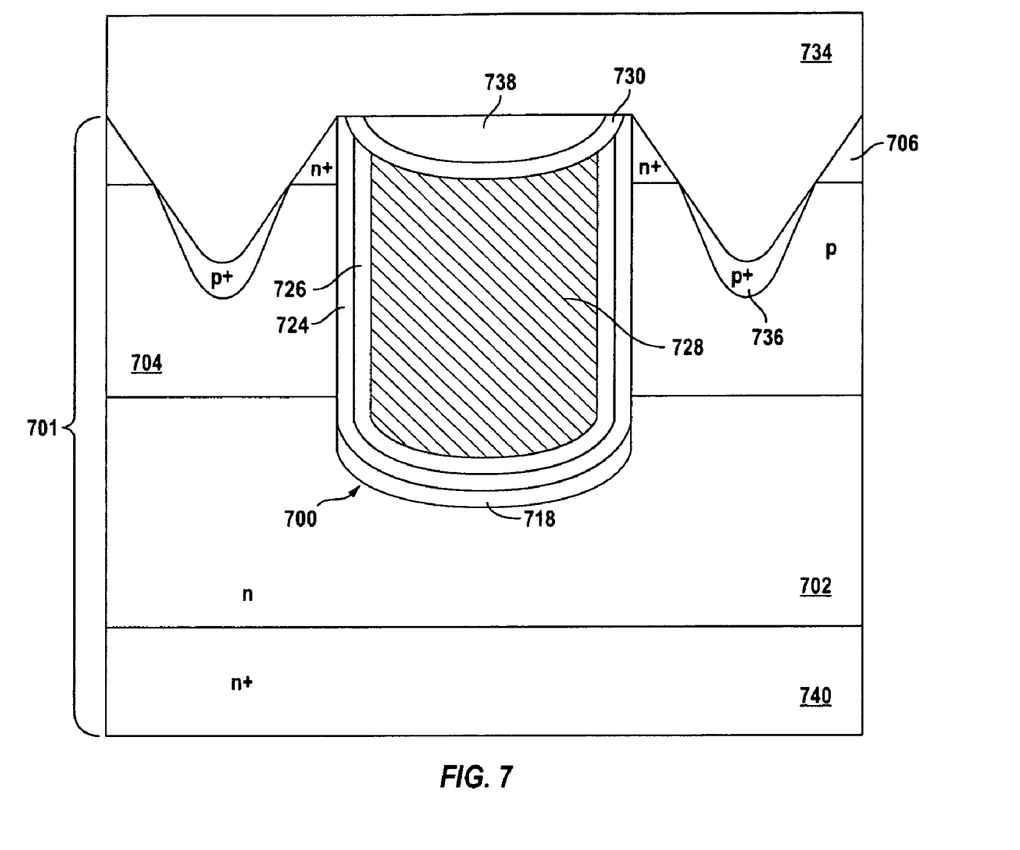
FIG. 7 is a simplified cross-sectional view of a trench-gate FET structure, according to an embodiment of the invention.

FIG. 7 is a simplified cross-sectional view of a trench-gate FET structure, according to another embodiment of the invention. The structure illustrated in FIG. 7 includes a low-k dielectric extending along the bottom of the trench to reduce gate charge by increasing the EOT of the trench bottom dielectric (TBD). The increased EOT reduces gate charge by reducing gate to drain capacitance. Further, the low-k TBD helps reduce the electric field along the bottom of the trench where avalanche breakdown occurs due to high fields.

The structure illustrated in FIG. 7 may be formed using processes similar to those described above. Body regions 704, source regions 706, and trench 700 may be formed in a manner similar to that described with regard to FIG. 1A-1C or 2A-2C. Low-k dielectric 718 may be formed in a manner similar to that described with regard to FIGS. 5A-5C, which may include filling trench 700 with a low-k dielectric and then performing a conventional recess etch to form low-k dielectric 718 along the bottom of trench 700. High-k dielectric 624 may be formed along the trench sidewalls and over low-k dielectric 718 using a conventional high-k deposition process, as described with regard to FIGS. 3E and 5D. The gate dielectric in the embodiment shown in FIG. 7 does not include a dielectric separate from the high-k dielectric as shown in the previous embodiments. A separate dielectric may be formed, however, as described with regard to FIGS. 3D and 5C. Conductive liner 726, gate electrode 728, dielectric liner 730, and dielectric cap 738 may each be formed as described in FIGS. 3F-3I and 5E-5H. Conductive interconnect layer 734, heavy body regions 736, and the triangular-shaped contacts may be formed as described with regard to FIG. 4.

Note that while the embodiments depicted in the figures show n-channel FETs, p-channel FETs may be obtained by reversing the polarity of the various semiconductor regions. Further, in embodiments where the semiconductor regions include an epitaxial layer extending over a substrate, MOSFETs are obtained where the substrate and epitaxial layer are of the same conductivity type, and IGBTs are obtained where the substrate has the opposite conductivity type to that of the epitaxial layer.

Although a number of specific embodiments are shown and described above, embodiments of the invention are not limited thereto. For example, the various embodiments described above may be implemented in silicon, silicon carbide, gallium arsenide, gallium nitride, diamond, or other semiconductor materials. Further, the features of one or more embodiments of the invention may be combined with one or more features of other embodiments of the invention without departing from the scope of the invention.

Therefore, the scope of the present invention should be determined not with reference to the above description but should be determined with reference to the appended claims, along with their full scope of equivalents.

The invention claimed is:

1. A shielded gate trench field effect transistor (FET), comprising:
   trenches extending into a semiconductor region;
   a shield electrode in a bottom portion of each trench, the shield electrode being insulated from the semiconductor region by a shield dielectric;
   a gate electrode over the shield electrode; and
   an inter-electrode dielectric (IED) extending between the shield electrode and the gate electrode, the IED comprising an insulating material comprising undoped oxide in a central portion of the IED and a low-k dielectric extending along sides and bottom of the insulating material.

2. The shielded gate trench FET of claim 1 wherein the IED comprises a high-k dielectric, the high-k dielectric extending between the low-k dielectric and the gate electrode.

3. The shielded gate trench FET of claim 1 wherein the gate electrode comprises metal.

4. The shielded gate trench FET of claim 1 further comprising:
   a conductive liner extending between the gate electrode and the semiconductor region.

5. The shielded gate trench FET of claim 1 wherein the semiconductor region further comprises:
   a drift region of a first conductivity type extending over a substrate, the substrate having a higher doping concentration than the drift region;
   a body region of a second conductivity type extending over the drift region; and
   source regions of the first conductivity type adjacent to each trench in the body region, wherein the trenches extend into and terminate within the substrate.

6. The shielded gate trench FET of claim 1 wherein the semiconductor region comprises:
   a drift region of a first conductivity type extending over a substrate, the substrate having a higher doping concentration than the drift region;
   a body region of a second conductivity type extending over the drift region; and
   source regions of the first conductivity type adjacent to each trench in the body region, wherein the trenches extend into and terminate within the drift region.

7. The shielded gate trench FET of claim 6 wherein top surfaces of the IED are recessed relative to the body region.

8. The shielded gate trench FET of claim 6 further comprising:
   an interconnect layer extending over the semiconductor region, the interconnect layer contacting the source regions and being isolated from the gate electrode by a dielectric cap; and
   a dielectric liner comprising nitride extending between the dielectric cap and the gate electrode.

9. The shielded gate trench FET of claim 1 including a gate dielectric lining upper trench sidewalls, the gate dielectric comprising a high-k dielectric.

10. The shielded gate trench FET of claim 9 wherein the high-k dielectric comprises oxide, and a concentration of the oxide is graded along a thickness of the high-k dielectric, the concentration of the oxide being highest in a portion of the high-k dielectric nearest the semiconductor region.

11. The shielded gate trench FET of claim 9 wherein the high-k dielectric extends along a bottom of the gate electrode.

12. The shielded gate trench FET of claim 9 wherein a physical thickness of the IED is less than the physical thickness of the gate dielectric.

13. The shielded gate trench FET of claim 9 wherein the gate dielectric further comprises thermal oxide.

14. A shielded gate trench field effect transistor (FET), comprising:
   trenches extending into a semiconductor region;
   a shield electrode in a bottom portion of each trench;
   a gate electrode over the shield electrode;
   an inter-electrode dielectric (IED) extending between the shield electrode and the gate electrode, the IED comprising a low-k dielectric and an oxide region, the low-k dielectric extending along each side and a bottom of the oxide region; and
   a gate dielectric extending between the gate electrode and the semiconductor region, the gate dielectric comprising a high-k dielectric.

15. The shielded gate trench FET of claim 14 wherein the high-k dielectric comprises oxide, and a concentration of the oxide is graded along a thickness of the high-k dielectric, the concentration of the oxide being highest in a portion of the high-k dielectric nearest the semiconductor region.

16. The shielded gate trench FET of claim 14 wherein the high-k dielectric extends along a bottom of the gate electrode.

17. The shielded gate trench FET of claim 14 further comprising:
   a gate dielectric lining upper trench sidewalls; and
   a conductive liner extending between the gate electrode and the gate dielectric.

18. The shielded gate trench FET of claim 14 wherein the gate electrode comprises metal.

19. A shielded gate trench field effect transistor (FET), comprising:
   trenches extending into a semiconductor region;
   a shield electrode in a bottom portion of each trench, the shield electrode being insulated from the semiconductor region by a shield dielectric;
   a gate electrode over the shield electrode;
   a conductive liner extending between the gate electrode and the semiconductor region; and
   an inter-electrode dielectric (IED) extending between the shield electrode and the gate electrode, the IED comprising a low-k dielectric.

20. The shielded gate trench FET of claim 19 wherein the IED comprises a high-k dielectric, the high-k dielectric extending between the low-k dielectric and the gate electrode.

21. The shielded gate trench FET of claim 19 wherein the gate electrode comprises metal.

22. The shielded gate trench FET of claim 19 wherein the semiconductor region further comprises:
   a drift region of a first conductivity type extending over a substrate, the substrate having a higher doping concentration than the drift region;
   a body region of a second conductivity type extending over the drift region; and
   source regions of the first conductivity type adjacent to each trench in the body region.

23. The shielded gate trench FET of claim 19 including a gate dielectric lining upper trench sidewalls and extending between the conductive liner and the semiconductor region, the gate dielectric comprising a high-k dielectric.

* * * * *